United States Patent [19]
Aoki

[11] Patent Number: 6,125,069
[45] Date of Patent: Sep. 26, 2000

[54] SEMICONDUCTOR MEMORY DEVICE WITH REDUNDANCY CIRCUIT HAVING A REFERENCE RESISTANCE

[75] Inventor: Mamoru Aoki, Tokyo, Japan

[73] Assignee: NEC Corporation, Tokyo, Japan

[21] Appl. No.: 09/420,779

[22] Filed: Oct. 19, 1999

[30] Foreign Application Priority Data

Nov. 5, 1998 [JP] Japan .................................. 10-314305
Jun. 16, 1999 [JP] Japan .................................. 11-169437

[51] Int. Cl.⁷ ............................. G11C 7/00; H03K 19/007
[52] U.S. Cl. ................ 365/225.7; 365/200; 365/230.08; 326/12; 326/13; 327/199; 327/525; 327/526
[58] Field of Search .............................. 365/225.7, 200, 365/230.08; 326/12, 13, 10; 327/199, 524, 525, 526

[56] References Cited

U.S. PATENT DOCUMENTS

| | | | |
|---|---|---|---|
| 5,345,110 | 9/1994 | Renfro et al. | 327/199 |
| 5,617,366 | 4/1997 | Yoo | 365/201 |
| 5,619,469 | 4/1997 | Joo | 365/225.7 |
| 5,929,691 | 7/1999 | Kim et al. | 327/525 |

*Primary Examiner*—Andrew Q. Tran
*Attorney, Agent, or Firm*—Sughrue, Mion, Zinn, Macpeak & Seas, PLLC

[57] ABSTRACT

A semiconductor memory device with a redundancy circuit includes a reference section, a fuse section and a latch section. The reference section includes a reference resistance and supplies a first current to the reference resistance. The fuse section includes a fuse and supplies a second current to the fuse. The second current is proportional to the first current. The latch section has a threshold and latches a fuse state data based on the threshold and a voltage drop across the fuse. The fuse state data indicates whether or not the fuse is cut.

32 Claims, 16 Drawing Sheets

Fig. 9A　IN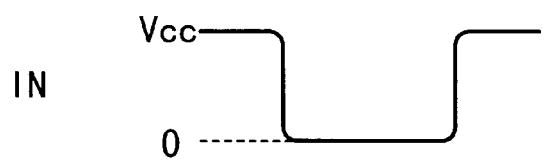
Fig. 9B　A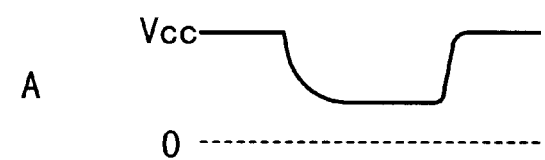
Fig. 9C　B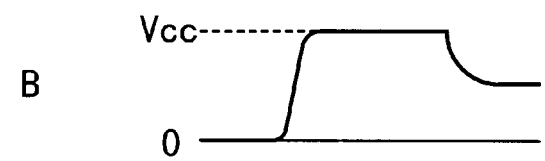
Fig. 9D　OUT UNDEFINED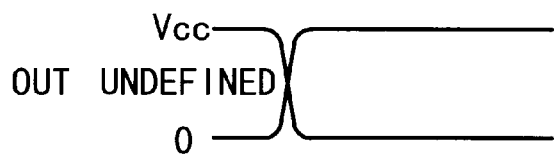

SEMICONDUCTOR MEMORY DEVICE WITH REDUNDANCY CIRCUIT HAVING A REFERENCE RESISTANCE

BACKGROUND OF THE INVENTION

1. Field of the Invention

The present invention relates to a semiconductor memory device. More particularly, the present invention relates to a semiconductor memory device with a redundancy circuit in which power supply voltage dependence and temperature dependence of a critical resistance of a fuse are small.

2. Description of the Related Art

In a semiconductor memory device, the probability that a fault memory cell is contained increases as the memory capacity of the memory device increases. For this reason, in order to prevent the decrease of a production yield, a redundant memory cell area of a redundancy circuit is provided for the semiconductor memory device. When the fault memory cell is replaced by a redundant memory cell, the replacement by the redundant memory cell is carried out by setting an address of the fault memory cell to the fuse.

In the step that a semiconductor memory device is formed on a wafer, the operation confirmation of the memory device is carried out to detect any fault memory cell. A fuse is cut using a laser beam so that an address corresponding to the detected fault memory cell is set to the fuse. Then, the wafer is divided into chips, and each chip is incorporated into a package and is forwarded as the semiconductor memory device. In this way, a redundancy circuit is provided for spare memory cells to increase the production yield of the semiconductor memory device. A redundancy fuse of a fuse window of the redundancy circuit is set to the ON (not cut) or OFF (cut) state so that the address of the fault memory cell is specified.

Then, the semiconductor memory device is incorporated into an electronic appliance. When the electronic appliance is turned on and the fault memory cell is accessed, reading and writing operations are carried out to the redundant memory cell in place of the fault memory cell. In this case, conventionally, it is determined whether or not an address indicative of an address signal is coincident with the address set to the fuses, every time the address signal is supplied to the semiconductor memory device.

Recently, as the memory capacity increases, the number of redundancy circuits increases and the number of address signals increases, too. Therefore, it is necessary to use a lot of fuses for replacement by the redundancy memory cells in the redundant circuit. When the number of fuses increases, the signal lines connected with the fuses become long and a parasitic capacity of the signal line increases. For this reason, it takes a long time to read the ON/OFF state of the fuse.

Also, because a current flows to read the ON/OFF state of the fuse every time an address signal is supplied to the semiconductor memory device, the consumption current increases, too.

Therefore, a method is proposed in which the ON/OFF state of the fuse is determined in the initial step when a power supply is turned on, the determination result is latched and a redundancy circuit is accessed based on the latched determination result. Such a method is disclosed in U.S. Pat. No. 5,345,110 entitled "LOW-POWER FUSE DETECT AND LATCH CIRCUIT".

FIG. 1 shows a fuse determination circuit disclosed in the U.S. Pat. No. 5,345,110. The fuse determination circuit is composed of a redundant fuse 10, an N-channel metal oxide semiconductor transistor 12, a P-channel MOS transistor 14, and inverters 16, 17 and 18. The one end of the fuse 10 is connected with the ground potential and the source of the P-channel transistor 14 is connected with a power supply voltage Vcc. The N-channel transistor 12 and the P-channel transistor 14 and the inverter 16 form the fuse determining section. Two inverters 17 and 18 are connected in a reverse manner in parallel and forms the latch section.

A pulse signal of a High level is externally supplied to an input terminal IN for a short time so as to read whether or not the fuse 10 is cut. The N-channel transistor 12 and the P-channel transistor 14 are turned on during the High level period of the pulse signal on the input terminal IN. When the fuse is completely cut, a determination node B is set to the High level so that an output terminal OUT is set to a Low level via the inverter 17. The Low level output is fed back to the determination node B via the inverter 18 and the data is latched.

On the other hand, when the fuse is not completely cut, the current flows through the N-channel transistor 12 and the P-channel transistor 14 so that the determination node B is set to the Low level. The output terminal OUT is set to the High level via the inverter 17. The High level output is fed back to the determination node B via the inverter 18 and the data is latched.

In this reference, the gate width of the transistor is adjusted in such a manner that the ON resistance of the N-channel transistor 12 is small, compared with the ON resistance of the P-channel transistor 14. Therefore, even if the transistors 12 and 14 are turned on at the same time, the voltage of the determination node B can be set to the Low level. Thus, the ON/OFF state of the fuse can be determined based on the signal from output terminal OUT.

The cutting of the fuse is generally carried out using a laser beam. In this case, there is a case that the fuse is not completely cut. This state is referred to as a partially-cut state in the specification. In case of such a "partially-cut" state, the voltage of the determination node B is determined by the ratio of the ON resistance of the P-channel transistor 14 and the resistance of the fuse 10 in the partially-cut state. When the voltage of the determination node B exceeds the threshold of the inverter 17, the output terminal OUT is set to the Low level. Also, when the voltage of the determination node B does not exceed the threshold of the inverter 17, the output terminal OUT is set to the High level. In this way, the state of ON/OFF of the fuse is determined based on whether the voltage of the determination node B exceeds the threshold of the inverter 17, even when the fuse is in the partially-cut state. It should be noted that the resistance value of the fuse as a reference when whether the fuse is in the ON state or the OFF state is determined is referred to as a critical resistance.

The conventional fuse determination circuit shown in FIG. 1 has the following problem. That is, because the voltage Vgs between the gate and the source in the P-channel transistor 14 changes largely depending upon the power supply voltage Vcc, the ON resistance of the P-channel transistor 14 changes when the power supply voltage Vcc changes. As a result, the ratio of the ON resistance and the resistance of the fuse changes so that the power supply voltage dependence of the critical resistance of the fuse becomes large. Also, the critical resistance of the fuse depends on the temperature. Therefore, when the fuse is not cut completely so that the resistance of the fuse is a value near the critical resistance, there would be a case where the ON state and the OFF state of the fuse is determined oppositely depending on the power supply voltage and the temperature.

Usually, the semiconductor memory device is applied with a predetermined power supply voltage at the room temperature and the voltage of the output terminal OUT is confirmed. If the output terminal OUT is in the Low level, the laser beam is irradiated once again to cut the fuse. However, if the output terminal OUT is in the High level, it is regarded that the fuse is completely cut, even if the fuse is in the partially-cut state. Thus, the test is ended.

The semiconductor memory devices with the fuse in the partially-cut state could be further removed if the power supply voltage and the temperature are changed and the test is repeated. However, an enormous time is taken for the test and the production cost of the semiconductor memory device increases.

Also, if usage ranges of the power supply voltage and the temperature are limited, the probability of the erroneous determination becomes low. However, the semiconductor memory device is limited in a practical use and can be used only for a special electronic appliance. Therefore, the possibility that the defective product could not be excluded through the test of the memory device increases.

As described above, depending on the power supply voltage, the semiconductor memory device which is determined as the OFF state through the test is possibly determined as the ON state. As a result, a data could not be correctly read from and written in the memory device.

Moreover, in the conventional fuse determination circuit, the gate of the P-channel transistor 14 is driven with a logic level of the High level or the Low level. Therefore, it is not possible to decrease a DC current which flows through the fuse 10 at the time of the level determination and the consumption power of the fuse determining section can not be adjusted.

If the semiconductor memory device apparatus has an internal circuit for stabilizing the power supply voltage, the dependence on the external power supply voltage can be decreased. In this case, however, elements increase to form the stabilizing circuit. Also, two wiring lines for the external power supply and the internal power supply must be arranged. Therefore, the layout area of the semiconductor memory device becomes large. Moreover, even if the power supply voltage dependence can be reduced, the temperature dependence cannot be compensated.

In the conventional fuse determination circuit, because the ON resistance of the P-channel transistor 14 and the resistance of fuse 10 are compared, the relation of (the size of the P-channel transistor 14)<(the size of the N-channel transistor 12) is necessary to be satisfied. Hundreds of fuse determination circuits are formed on the chip. Therefore, the layout area becomes large when the size of the N-channel transistor 12 becomes large.

Also, during the High level period of the pulse signal on the input terminal IN, the determination node B is driven by the P-channel transistor 14 and fuse 10. However, there is a problem that the critical resistance of the fuse changes depending upon the previous latch state because of competition with the inverter 18.

SUMMARY OF THE INVENTION

Therefore, an object of the present invention is to provide a semiconductor memory device with a redundancy circuit in which the power supply voltage dependency and temperature dependency of a critical resistance of a fuse are small.

Another object of the present invention is to provide a semiconductor memory device with a redundancy circuit in which a DC current which flows through a fuse during the determination period can be made small.

Still another object of the present invention is to provide a semiconductor memory device with a redundancy circuit which can be realized in a smaller layout area.

Yet still another object of the present invention is to provide a redundancy circuit with a fuse determination circuit.

In order to achieve an aspect of the present invention, a semiconductor memory device with a redundancy circuit includes a reference section, a fuse section and a latch section. The reference section includes a reference resistance and supplies a first current to the reference resistance. The fuse section includes a fuse and supplies a second current to the fuse. The second current is proportional to the first current. The latch section has a threshold and latches a fuse state data based on the threshold and a voltage drop across the fuse. The fuse state data indicates whether or not the fuse is cut.

Here, the reference section may include a first transistor which supplies the first current to the reference resistance, and the fuse section may include a second transistor which supplies the second current to the fuse. A current mirror circuit comprises the first transistor and the second transistor. In this case, when the first and second transistors are MOS transistors, the redundancy circuit may further include a third transistor provided between a power supply line and gates of the first and second MOS transistors. Also, the gate of the first MOS transistor is connected to one of a source and a drain on a side of the fuse.

Also, the first transistor includes a plurality of fourth MOS transistors and a plurality of switches. The plurality of fourth MOS transistors are provided in parallel, and gates of the plurality of fourth MOS transistors are connected to a gate of the second MOS transistor. The plurality of switches are respectively provided for the plurality of fourth MOS transistors, and each of the plurality of switches selectively connects the gate of a corresponding one of the plurality of fourth MOS transistor and one of a source and a drain of the corresponding fourth MOS transistor. In this case, the plurality of fourth MOS transistors have different ratios of a gate width and a gate length.

Also, the reference section includes a first switching transistor provided between the first transistor and the reference resistance, and the fuse section includes a second switching transistor provided between the second transistor and the fuse. The first switching transistor is turned on in response to a detection instruction, and the second switching transistor is turned on in response to the detection instruction. In this case, the detection instruction may be a one-shot pulse signal. Also, the latch section includes a first inverter connected at its input to a node between the second transistor and the second switching transistor, and a second inverter connected at its input to an output of the first inverter and at its output to the input of the first inverter. Also, the latch section latches the fuse state data based on a voltage at the node and the threshold of the first inverter.

Also, the latch section may further include a gate circuit which is provided between the node and the input of the first inverter, and which sets a path between the node and the input of the first inverter to a conductive state in response to the detection instruction. Alternatively, the latch section may further include a gate circuit which is provided between the input of the first inverter and the output of the second inverter, and which sets a path between the input of the first inverter and the output of the second inverter to a conductive state in response to the detection instruction.

Also, it is preferable that the reference resistance and the fuse are formed of the same material.

In order to achieve another aspect of the present invention, a semiconductor memory device includes a reference section, a plurality of fuse sections and a plurality of latch sections. The reference section includes a reference resistance and supplies a first current to the reference resistance. The plurality of fuse sections are respectively provided for address bits. Each of the plurality of fuse sections includes a fuse and supplying a second current to the fuse, the second current being proportional to the first current. The plurality of latch sections are respectively provided for the plurality of fuse sections. Each of the plurality of latch sections has a threshold and latches a fuse state data of a corresponding one of the plurality of fuse sections based on the threshold and a voltage drop across the fuse of the corresponding fuse section. The fuse state data indicates whether or not the fuse is cut.

In this case, the reference section includes a first transistor which supplies the first current to the reference resistance, and each of the plurality of fuse sections includes a second transistor which supplies the second current to the fuse. A current mirror circuit includes the first transistor and the second transistors. In this case, the first and second transistors are MOS transistors, and the semiconductor memory device may further include a third transistor provided between a power supply line and gates of the first and second MOS transistors. In this case, the gate of the first MOS transistor may be connected to one of a source and a drain on a side of the fuse.

Also, the first transistor may include a plurality of fourth MOS transistors and a plurality of switches. The plurality of fourth MOS transistors are provided in parallel, and gates of the plurality of fourth MOS transistors are connected to a gate of the second MOS transistor. The plurality of switches are respectively provided for the plurality of fourth MOS transistors, and each of the plurality of switches selectively connects the gate of a corresponding one of the plurality of fourth MOS transistor and one of a source and a drain of the corresponding fourth MOS transistor.

Also, the plurality of fourth MOS transistors have different ratios of a gate width and a gate length.

Also, the reference section includes a first switching transistor provided between the first transistor and the reference resistance, the first switching transistor being turned on in response to a detection instruction. Each of the plurality of fuse sections includes a second switching transistor provided between the second transistor and the fuse, the second switching transistor being turned on in response to the detection instruction. In this case, the detection instruction is a one-shot pulse signal.

Also, each of the plurality of latch sections may include a first inverter connected at its input to a node between the second transistor and the second switching transistor in the corresponding fuse section, and a second inverter connected at its input to an output of the first inverter and at its output to the input of the first inverter. In this case, each of the plurality of latch sections latches the fuse state data based on a voltage at the node and the threshold of the first inverter in the corresponding fuse section.

Also, each of the plurality of latch sections may further include a gate circuit which is provided between the node and the input of the first inverter in the corresponding fuse section, and which sets a path between the node and the input of the first inverter in the corresponding fuse section to a conductive state in response to the detection instruction. Alternatively, each of the plurality of latch sections may further include a gate circuit which is provided between the input of the first inverter and the output of the second inverter in the corresponding fuse section, and which sets a path between the input of the first inverter and the output of the second inverter in the corresponding fuse section to a conductive state in response to the detection instruction.

It is preferable that the reference resistance and the fuses are formed of the same material.

The semiconductor memory device may further include a control fuse section, a control fuse section, an address determining section and a driving circuit. The control fuse section includes a control fuse and supplying a third current to the control fuse, and the third current is proportional to the first current. The latch section has a threshold and latches a control fuse state data of the control fuse section based on the threshold and a voltage drop across the control fuse in the control fuse section, and the control fuse state data indicates whether or not the fuse is cut. The address determining section determines whether the fuse state data from the plurality of fuse sections are all coincident with the address bits in units of address bits, and outputs a permission signal to permit access to redundancy memory cells when the fuse state data from the plurality of fuse sections are all coincident with the address bits in units of address bits. The driving circuit drives the address determining section in response to the control fuse state data. In this case, the reference resistance, the fuses and the control fuse may be formed of the same material.

In order to achieve still another aspect of the present invention, a semiconductor memory device with a redundancy circuit includes a reference section, a fuse section and a determining section. The reference section includes a reference resistance and supplies a first current to the reference resistance. The fuse section includes a fuse and supplies a second current to the fuse, the second current being proportional to the first current. The determining section compares a threshold and a voltage drop across the fuse to determine whether a fuse is cut. In this case, a determination period circuit permits the supplies of the first and second current for a determination period. Also, the reference resistance and the fuse may be formed of the same material.

BRIEF DESCRIPTION OF THE DRAWINGS

FIGS. 9A to 9D are waveform diagrams showing the operation of the redundancy circuit according to the fourth embodiment of the present invention;

DESCRIPTION OF THE PREFERRED EMBODIMENTS

Next, a semiconductor memory device with a redundancy circuit of the present invention will be described below in detail with the reference to the attached drawings.

Figure 2:
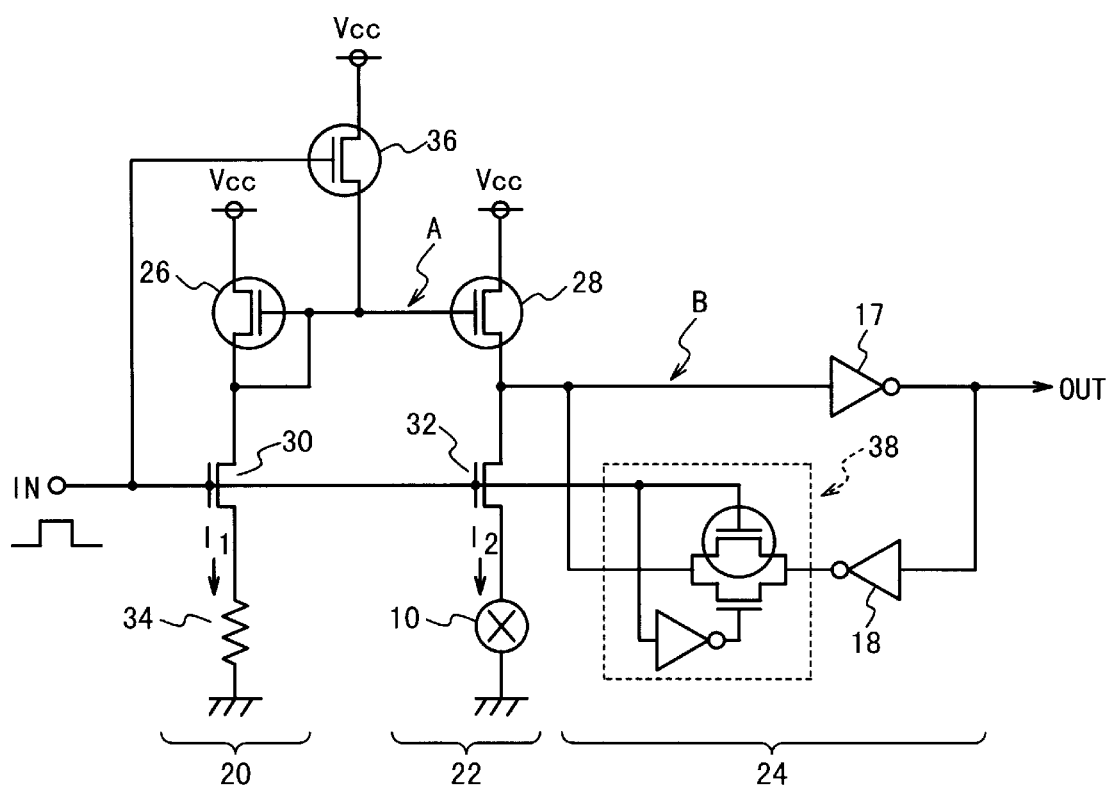
FIG. 2 is a schematic circuit diagram showing the basic part of an example of a redundancy circuit of a semiconductor memory device according to a first embodiment of the present invention.

FIG. 2 is a schematic diagram showing the structure of a basic part of a fuse determination circuit of the redundancy circuit according to the first embodiment of the present invention. Referring to FIG. 2, the fuse determination circuit is composed of the reference section 20, a fuse section 22 and a latch section 24.

The reference section 20 is composed of the P-channel MOS transistors 26 and 36, an N-channel metal oxide semiconductor transistor 30 and the reference resistance 34 of about 8 kΩ. The fuse section 22 is composed of the P-channel MOS transistor 28, an N-channel metal oxide semiconductor channel transistor 32 and a fuse 10. The latch section 24 is composed of the inverters 17 and 18 connected inversely in parallel and the transfer gate 38 inserted on the output side of the inverter 18.

An input terminal IN is connected with the gates of the N-channel transistors 30 and 32, the gate of the P-channel transistor 36 and the gate on the side of the P-channel transistor of the transfer gate 38. Also, the input terminal IN is connected with the gate on the side of the N-channel transistor of the transfer gate 38 through the inverter.

The sources of the P-channel transistors 26 and 36 in the reference section 20 are connected with the power supply voltage Vcc of 3 V. One end of the reference resistance 34 is connected with the source of the N-channel transistor 30 and the other end thereof is connected with the ground. The P-channel transistor 26 has a gate and a drain which are connected to each other, and forms a current mirror circuit together with the P-channel transistor 28 of the fuse section 22. Current I1 flows through the P-channel transistor 26 and is determined based on the current characteristic of the transistor 26 itself, the power supply voltage Vcc and the reference resistance 34. Current I2 flows through the P-channel transistor 28 and is proportional to a size ratio between the transistor 28 and the transistor 26. The gate voltage Vg of the P-channel transistor 26 is equal to a product of the resistance value of the reference resistance 34 and the current I1 and is about a half of the power supply voltage Vcc, i.e., about 1.5 V. In this way, the P-channel transistor 26 functions as a level shifter to decrease the power supply voltage Vcc to a predetermined voltage.

The source of the P-channel transistor 28 of the fuse section 22 is connected with the power supply voltage Vcc. The source of the N-channel transistor 32 is connected with the corresponding fuse 10 of a fuse window. The other end of the fuse 10 is connected with the ground. The P-channel transistor 28 forms a constant current source. In order to decrease the DC current flowing from this constant current source, the P-channel transistor 28 forms a current mirror circuit together with the P-channel transistor 26 of the reference section 20 as above-mentioned. As a result, the gate of the P-channel transistor 28 can be driven in a middle level between the power supply voltage Vcc and the ground voltage. Thus, by adopting such a current mirror circuit structure, the power supply voltage dependency and temperature dependence of the critical resistance of the fuse can be made small as described later.

The output of the inverter 17 of the latch section 24 is connected with an output terminal OUT and moreover is connected with the input of the inverter 17 via the inverter 18 and the transfer gate 38.

Figure 3:
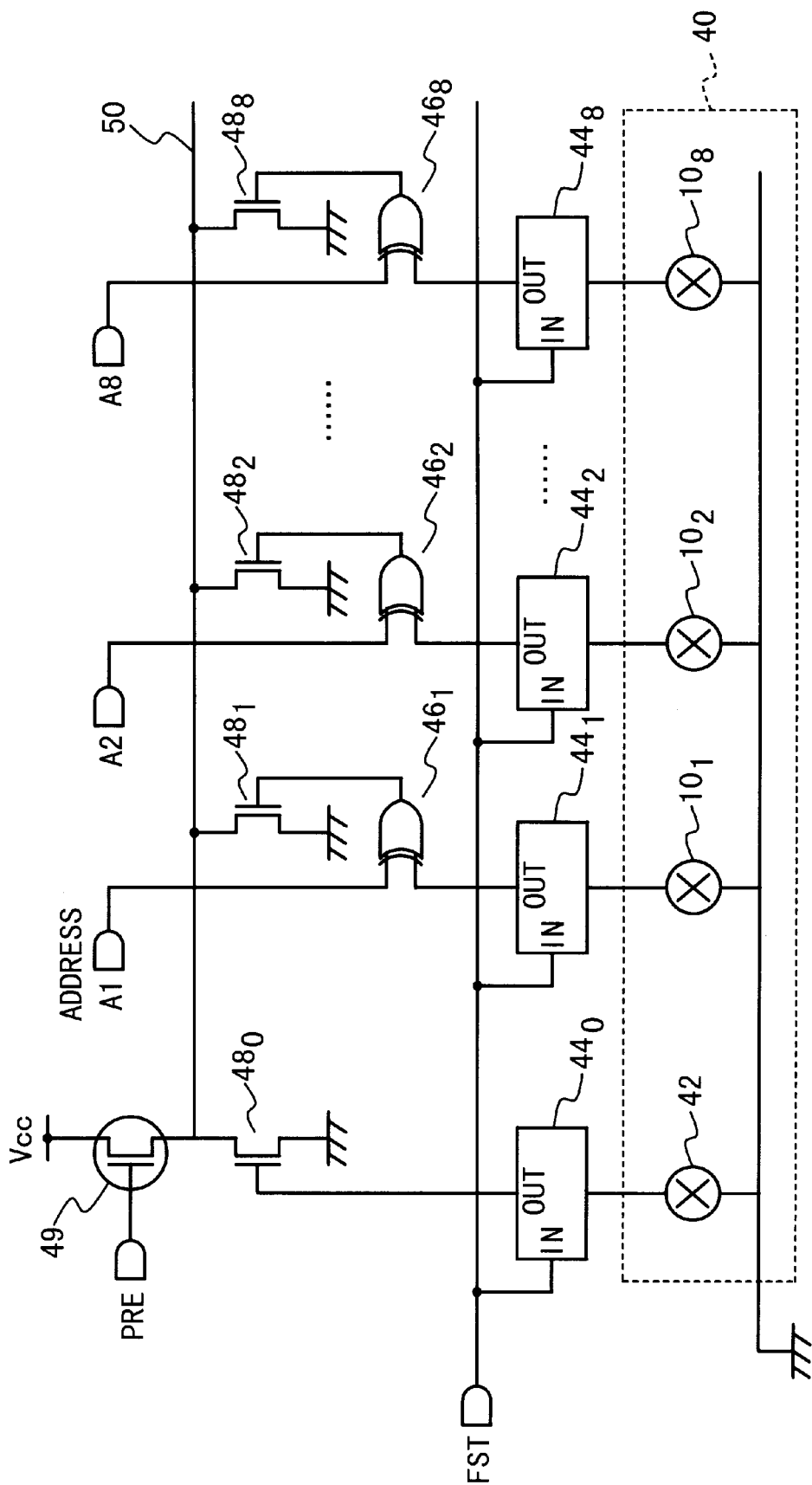
FIG. 3 is a diagram showing the peripheral structure of the redundancy circuit according to the first embodiment of the present invention.

FIG. 3 is a diagram showing the structure of the redundancy circuit in which the fuse determination circuit shown in FIG. 2 is provided. In this embodiment, the case where eight address signals are supplied will be described as an example. However, the present invention is not limited to this example.

One enable fuse 42 and eight redundant fuses $10_1$ to $10_8$ are arranged in the fuse window 40. The enable fuse 42 is used to set whether or not a memory cell is to be replaced by the redundancy memory cell. The fuse determination circuits $44_0$ to $44_8$ of FIG. 3 are connected with fuses 42 and $10_1$ to $10_8$. A fuse set signal FST is supplied to an input terminal IN of each of the fuse determination circuits. In an SDRAM, a command MDRS (mode register set) signal is generally supplied by the user for the mode setting before the use. The FST signal is a one-shot pulse signal generated from the MDRS signal and the pulse duration is about 30 ns. The FST signal is outputted when the power supply is turned on for the memory device and an electronic appliance outputs a reset signal. The FST signal is a trigger signal used to determine the ON/OFF state of the fuse.

In the redundancy circuit, a P-channel transistor 49 and an N-channel transistor $48_0$ are connected in series between the power supply voltage Vcc and the ground. A precharge signal PRE is supplied to the gate of the P-channel transistor 49. The output of the fuse determination circuits $44_0$ for the enable fuse 42 is supplied to the gate of the N-channel transistor $48_0$. A node 50 between the P-channel transistor 49 and the N-channel transistor $48_0$ is connected to drains of N-channel transistors $48_1$ to $48_8$. Sources of the N-channel transistors $48_1$ to $48_8$ are connected to the ground. Address signals A1 to A8 and the output signals of the fuse determination circuits $44_1$ to $44_8$ are supplied to Exclusive OR (EXOR) gates $46_1$ to $46_8$, respectively. The latch data outputted from the fuse determination circuits $44_1$ to $44_8$ and the address signals A1 to A8 supplied to the memory device cells are subjected to Exclusive OR (EXOR) calculations in the EXOR circuits $46_1$ to $46_8$, respectively.

The EXOR circuits $46_1$ to $46_8$ output Low level signals to the gates of the N-channel transistors $48_1$ to $48_8$ when two input logical levels are coincident with each other, and output High level signals when two input logical levels are not coincident with each other, respectively. The outputs of the EXOR circuit $46_1$ to $46_8$ and the latch data of the fuse determination circuit $44_0$ are connected to the node 50 in a wired-OR manner through the N-channel metal oxide semiconductor transistors $48_0$ to $48_8$. The wired-OR node 50 is connected to a redundancy determination circuit (not shown) of the redundancy circuit.

Next, the operation of the redundancy circuit shown in FIG. 3 will be described below.

First, at the time of initial setting, when the FST signal is set to a High level signal, the fuse determination circuits $44_0$ to $44_8$ determines the ON/OFF state of the fuses 42 and $10_1$ to $10_8$ to output the level corresponding to the determined ON/OFF state from the output terminal OUT, respectively.

Then, when the precharge signal PRE as an address determination enabling signal is set to the Low level so that the memory device is subjected to a read operation or a write operation, the P-channel MOS transistor 49 is turned on and the node 50 is set to the High level.

Next, the address signals A1 to A8 are supplied to the EXOR circuits $46_1$ to $46_8$ and it is determined whether the address signals A1 to A8 are respectively coincident with the outputs of the fuse determination circuits $44_1$ to $44_8$. When the supplied address signals A1 to A8 and all the outputs of the fuse determination circuits $44_1$ to $44_8$ are coincident with each other, all the EXOR circuits $46_1$ to $46_8$ are set to the Low level in output. This is because all the N-channel metal oxide semiconductor transistors are turned off, the node 50 is remained at the High level. If any of the address signals A1 to A8 and a corresponding one of the outputs of the fuse determination circuits $44_1$ to $44_8$ are not coincident with each other, a corresponding one of the EXOR circuits $46_1$ to $46_8$ is set to the High level. As a result, the N-channel metal oxide semiconductor transistor connected with this EXOR circuit is turned on. Therefore, the node 50 is set to the Low level. Also, when not using the redundancy circuit of the memory device, the enable fuse 42 is cut off (OFF) so that the output of the fuse determination circuit $44_0$ is set to the High level. Therefore, because the N-channel metal oxide semiconductor transistor $48_0$ connected with the fuse determination circuit $44_0$ is turned on, the node 50 is set to the Low level. In this way, the redundancy circuit compares the state set to the fuse and the supplied address and determines coincidence/non-coincidence.

The wired-OR node 50 as the output of the address determination circuit is connected with the address determination circuit (not shown) of the redundancy circuit of the memory device and determines whether or not the memory cell of the accessed address signal is replaced with the redundant memory cell.

Next, the operation of the fuse determination circuit of FIG. 2 will be described with reference to the waveforms of FIGS. 4A to 4F. The one-shot FST signal with the duration of about 30 ns shown in FIG. 4A, which is generated from the above-mentioned mode register command MDRS, is supplied to the input terminal IN. At this time, the N-channel transistors 30 and 32 are turned on, the P-channel transistor 36 is turned off and the transfer gate 38 is turned off during the period when the FST signal is set to the High level.

In the following description, it is supposed that the ON resistances of the N-channel transistors 30 and 32 are small sufficiently, for facilitate understanding.

Figure 4A:
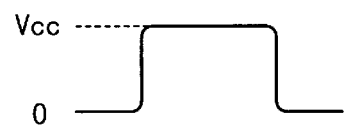
FIGS. 4A to 4F are waveform diagrams to explain the operation of the redundancy circuit according to the first embodiment of the present invention.
Figure 4B:
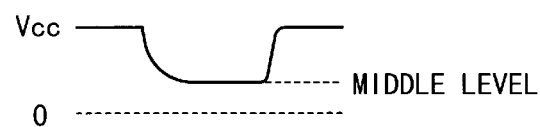

In the reference section 20, the N-channel transistor 30 is turned on and the P-channel transistor 36 is turned off so that the P-channel transistor 26 is turned on. Also, a current I1 flows through the reference resistance 34. As a result, as shown in FIG. 4B, the voltage of the node A falls down from the power supply voltage Vcc and is held at a middle level of the power supply voltage Vcc and ground potential, e.g., 1.3 V. Thus, the P-channel transistor 28 functioning as a constant current source is turned on.

Hereinafter, a case (I) that the fuse 10 is in an ON state, a case (II) that the fuse is in an OFF state, a case (III) that the fuse is in a partially-cut state of 60 kΩ, and a case (IV) that the fuse is in a partially-cut state of 100 kΩ will be described respectively.

(I) In Case that the Fuse is in an ON State

In the ON state of the fuse, the P-channel transistor 28 as the constant current source flows the DC current I2 in accordance with the voltage of the middle level of the node A. The DC current I2 is a passing-through current. Here, it is supposed that a ratio of the sizes of the P-channel transistors 26 and 28, i.e., the gate widths is 10:1, that the reference resistance 34 is 6.5 kΩ and that there is no potential drop in the N-channel transistors 30 and 32. In this case, the current I1 flows through the reference resistance 34 and is 0.2 mA (=1.3V/6.5 kΩ)

Figure 4C:
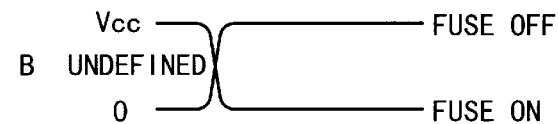
Figure 4D:
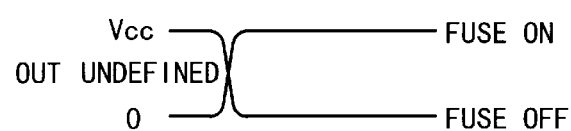

The P-channel transistors 26 and 28 form a current mirror circuit and the current I2 is proportional to the current I1. For this reason, the DC current I2 is about 20 $\mu$A which is about 1/10 of the current flowing through the reference resistance 34. The voltage of the determination node B is determined as the product of the ON current of the P-channel transistor 28 and the resistance value of the fuse 10. Supposing that the resistance value when the fuse is in the ON state is 3.3 kΩ, the voltage of the determination node B is set to 0.1 V which is a product of 20 $\mu$A of the ON currents and 3.3 kΩ. That is, as shown in FIG. 4C, the node B is set to the Low level which is inverted by the inverter 17. As a result, as shown in FIG. 4D, the output terminal OUT is set to the High level. When the FST signal of the input terminal IN is set to the Low level, the P-channel transistors 26 and 28 and N-channel transistors 30 and 32 are turned off so that the fuse determination is stopped. The transfer gate 38 is turned on so that the voltage of the determination node B is latched. Because the latched data, i.e., the data of the output terminal OUT is the High level, the fuse is determined to be in the ON state.

Also, when the FST signal is set to the Low level, the N-channel transistor 32 of the fuse determining section 22 is turned off so that the DC current I2 which flows through the fuse 10 is blocked off. The subsequent determining process is unnecessary because the determination of whether the fuse is in the ON or OFF state can be carried out in response to once supply of the FST signal and the determination result is held in the latch section 24. Therefore, because there is no case that the passing-through current flows through the fuse every time a memory device is accessed, consumption current can be reduced greatly.

(II) In Case of the Fuse in the OFF State

When the fuse is in the OFF state so that the resistance value is infinity, the determination node B is set to the High level as shown in FIG. 4C. As a result, the inverter 18 is inverted so that the output terminal OUT is set to the Low level, as shown in FIG. 4D. When the FST signal of the input terminal IN is set to the Low level, the fuse determination is stopped, and then the transfer gate 38 is turned on to latch the data. Because the latched data is the Low level, the fuse is determined to be in the OFF state.

(III) In Case of the Fuse in the Partially-cut State of 60 kΩ

When the fuse is in the partially-cut state, a small DC current I2 flows through the fuse 10, as in the fuse in the ON state. At this time, the voltage of the node B is determined based on the product of the ON current of the P-channel transistor 28 and the resistance value of the fuse 10. It is now supposed that the resistance value of the fuse in the partially-cut state is 60 kΩ. In this case, the voltage of the output terminal OUT is set to the High level or the Low level based on the voltage of the determination node B which is determined based on the product of the ON current and 60 kΩ. That is, when the voltage of the node B exceeds the threshold of the inverter 17, the output terminal OUT is set to the Low level. When the voltage of the node B does not exceed the threshold of the inverter 17, the output terminal OUT is set to the High level. For example, if the threshold of the inverter 17 is supposed to be set to ½ of the power supply voltage Vcc, i.e., the threshold is 1.5 V when the power supply voltage Vcc is 3 V. Also, in this example, it is supposed that the P-channel transistor 28 is an ideal constant current source and does not change depending upon the resistance value of the fuse 10.

Figure 4E:
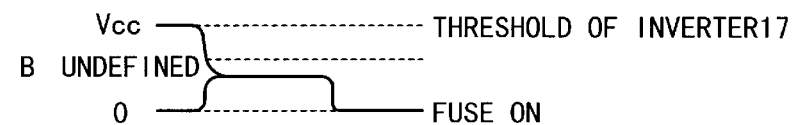

On the other hand, the voltage of the determination node B is a product of the ON current I2 of the P-channel transistor 28 and the resistance value of the fuse, i.e., 1.3 V (=20 μA ×60 kΩ) as shown in FIG. 4E. Therefore, because the input value is lower than the threshold, the inverter 17 sets to the output terminal OUT to the High level. When the FST signal of the input terminal IN is set to the Low level, the fuse determination is stopped. As a result, the transfer gate 38 is turned on to latch the data. The outputted latch data is in the High level and therefore the fuse is determined to be in the ON state.

(IV) In Case of the Fuse in the Partially-cut State of 100 kΩ

Figure 4F:
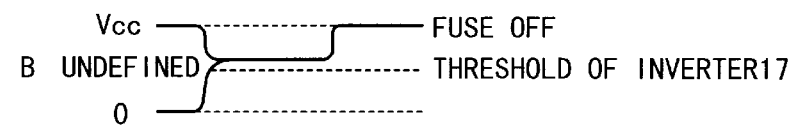

The fuse is in the partially-cut state of 100 kΩ and the voltage of the determination node B during the determination period is set to about 2.0 V as shown in FIG. 4F. This value is beyond 1.5 V as the threshold of the inverter 17, and the output terminal OUT is set to the Low level. When the FST signal of the input terminal IN is set to the Low level, the fuse determination is stopped. Then, the transfer gate 38 is turned on so that the voltage of the determination node B is latched. The outputted latch data is in the Low level and therefore the fuse is determined to be in the OFF state.

Here, the resistance value of the fuse 10 as a reference value used when the inverter 17 determines whether the fuse 10 is in ON or OFF state is referred to as a critical resistance. In the above-mentioned example, when the ON current I2 of the P-channel transistor 28 is 20 μA, the critical resistance is the resistance value of the fuse 10 when the voltage of the determination node B is set to the 1.5 V as the threshold of the inverter 17, and is 75 kΩ (=1.5V/20 μA).

In the fuse determination circuit shown in FIG. 2, the reason why the power supply voltage dependency and temperature dependence of the critical resistance of the fuse are made small will be described below.

Figure 5:
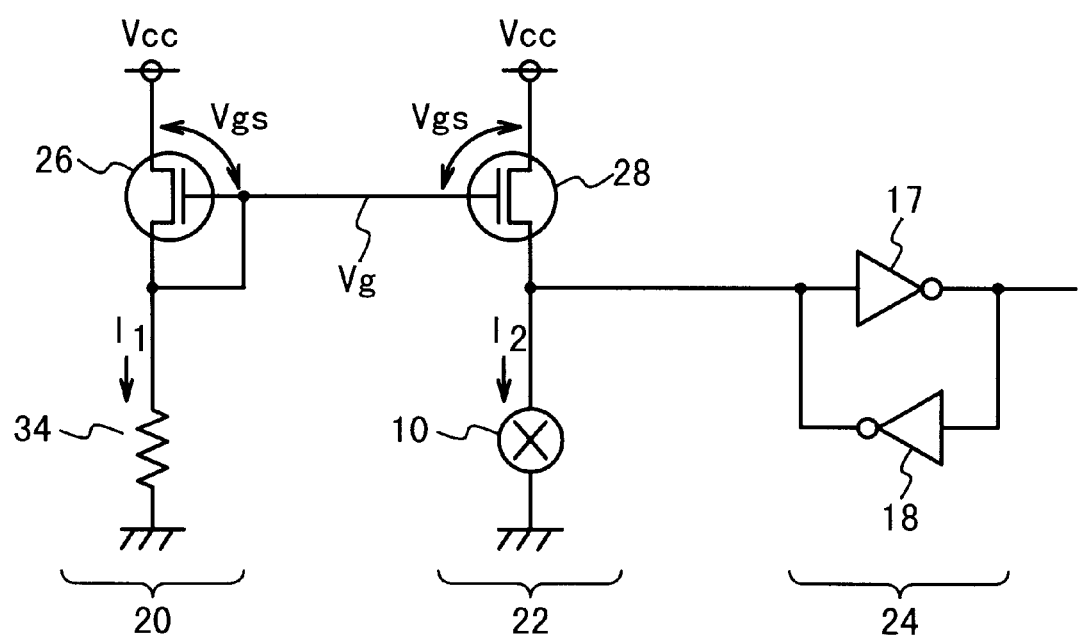
FIG. 5 is a schematic diagram to explain the power supply voltage dependence of the critical resistance of a fuse.

FIG. 5 is a schematic diagram to describe the power supply voltage dependency of the fuse resistance and the reference resistance and shows only the main section of the structure of FIG. 2. Referring to FIG. 5, it is supposed that the power supply voltage Vcc is made high so that the current I1 increases which flows through the reference section 20. In this case, the voltage drop in the reference resistance 34 becomes large, so that the gate voltage Vg of the P-channel transistor 28 of the fuse determining section 22 is set to the High level. On contrary, when the current I1 decreases, the gate voltage Vg is set to the Low level. As a result, the change of the voltage Vgs between the gate and the source in the P-channel transistor 28 can be suppressed when the power supply voltage Vcc is changed. Therefore, even if the power supply voltage Vcc changes, the ON resistance of the transistor 28 does not change largely, unlike the transistor 14 shown in FIG. 1. In this way, because the ratio of the ON resistance and the resistance of the fuse does not change largely, the power supply voltage dependency of the critical resistance of the fuse becomes small.

Figure 1:
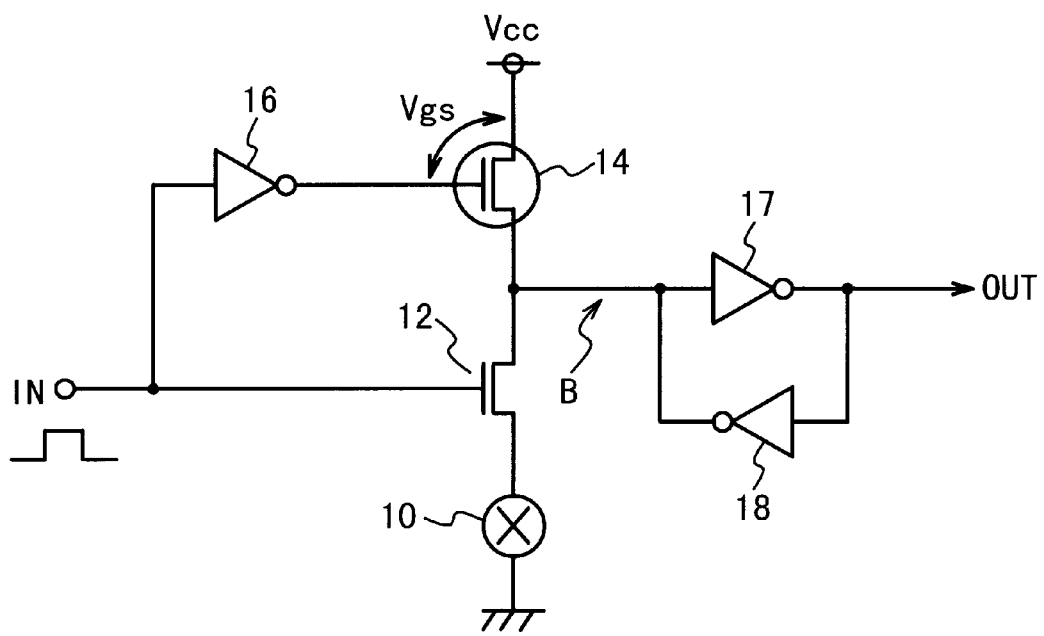
FIG. 1 is a diagram showing a conventional fuse determination circuit.

When the power supply voltage Vcc is changed, the simulation results of the changes of voltage Vgs between the gate and the source and fuse critical resistance are shown in the following table 1 in the redundancy circuit of the present invention of FIG. 5 and the conventional redundancy circuit of FIG. 1.

TABLE 1

| Vcc | Vgs | | critical resist. | |
| --- | --- | --- | --- | --- |
| | invent | convent | invent | convent |
| 2.5 V | 1.62 V | 2.5 V | 100 kΩ | 120 kΩ |
| 2.9 V | 1.66 V | 2.9 V | 90 kΩ | 100 kΩ |
| 3.7 V | 1.86 V | 3.7 V | 75 kΩ | 65 kΩ |
| 5.0 V | 1.88 V | 5.0 V | 65 kΩ | 50 kΩ |

When the power supply voltage Vcc is changed in a range of 2.5 to 5.0 V, the voltage Vgs between the gate and the source changes in the range of 2.5 to 5.0 V in the conventional circuit. However, in the redundancy circuit of the present invention, the change is suppressed to a small range of 1.62 to 1.88 V.

Also, the critical resistance change is in a range of 120 to 50 kΩ in the conventional circuit. However, in the redundancy circuit of the present invention, the critical resistance change is in a range of 100 to 65 kΩ. For example, it is supposed that the resistance value of the fuse 10 is 110 kΩ when the fuse determination circuit is tested in the power supply voltage Vcc of 2.9 V in the manufacturing test step. Because the fuse resistance value of 110 kΩ is larger than the critical resistance value of 90 kΩ in the present invention and the critical resistance value of 100 kΩ in the conventional example, the fuse determination circuit determines that the fuse 10 is in the OFF state.

Next, it is supposed that this memory device is incorporated into an electronic appliance and the power supply voltage of 2.5 V is used. In the present invention, the fuse determination circuit determines to be in the OFF state, because the fuse resistance value of 110 k Ω is larger than the critical resistance value of 100 kΩ. However, in the conventional example, the fuse determination circuit determines to be in the ON state, because the fuse resistance value of 110 kΩ is smaller than the critical resistance value of 120 kΩ. In this way, there is sometimes an erroneous determination of the fuse determination circuit, when the use condition is different between the manufacturing test step and the practical use step in the conventional example. In the memory device, there is a case that a memory cell is not replaced by a redundant memory cell regardless that the memory cell should be replaced by the redundant memory cell. As a result, it is not possible to carry out normal reading and writing operations.

In the conventional example, the temperature coefficient of the ON resistance of the P-channel transistor 14 and that of the resistance of the fuse 10 are not always coincident with each other so that the temperature dependence of the critical resistance is large. Therefore, there is the possibility that the erroneous determination is carried out as in the case of the power supply voltage. On the other hand, if the fuse 10 and the reference resistance 34 are made of the same materials, the fuse resistance and the reference resistance 34 shift to the same direction depending on the temperature change. This is because the temperature coefficients of these resistance values are the same in the fuse determination circuit of FIG. 5. Therefore, in the present invention, the temperature dependency of the critical resistance of the fuse 10 can be set to small, resulting in reduction of the possibility of the erroneous determination.

As described above, according to the fuse determination circuit of the redundancy circuit of the present invention, the power supply voltage dependence and temperature dependence of the critical resistance of the fuse are possible to be made small.

Moreover, the transfer gate 38 is provided in the feedback loop between the inverters 17 and 18 and the transfer gate 38 is turned off during the determination period. Therefore, the output current of the inverter 18 never flows through the fuse 10 so that the fuse determination can be carried out correctly based on the constant current I2. Because the latch section 52 is set to a stable state when there is not provided the transfer gate 38, energy and time are required for inversion of this state. However, in the present invention, the transfer gate 38 is provided to be turned off during the determination period. Therefore, the inverter 17 can determine the voltage of the determination node B at high speed without influence of the output of the inverter 18.

The fuse determination circuit according to the second to seventh embodiments of the present invention will be described below. FIGS. 6 to 12 show only a basic part, as in FIG. 2.

Figure 6:
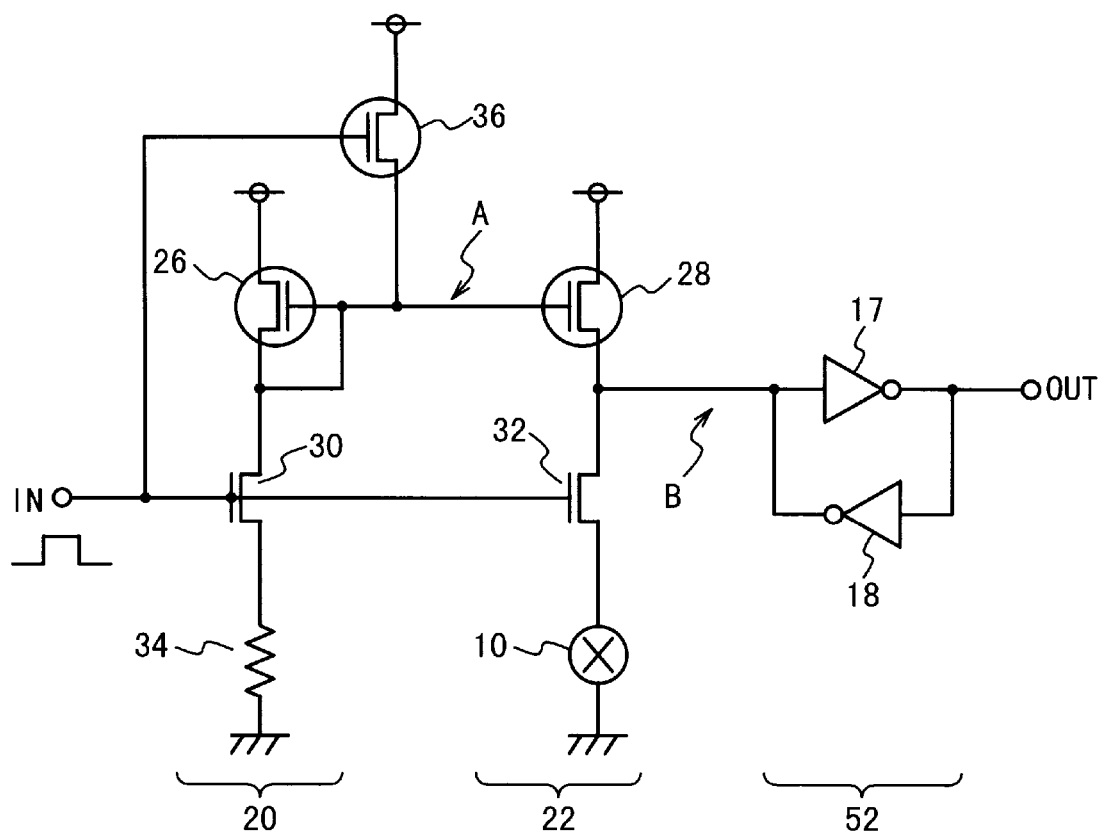
FIG. 6 is a diagram showing the redundancy circuit according to a second embodiment of the present invention.

The fuse determination circuit shown in FIG. 6 is different from the fuse determination circuit shown in FIG. 2 in only the structure of the latch section. That is, the latch section 52 of the fuse determination circuit of FIG. 6 is composed of the inverters 17 and 18 which are connected in parallel in a reverse manner. In the second embodiment, the current which flows through the fuse 10 is supplied from the transistor 28 and the inverter 18. When the voltage across the fuse 10 due to these currents exceeds the threshold of the inverter 17, the latch section 52 is set to the Low level. When the voltage does not exceed the threshold, the latch section 52 is set to the High level. In this case, the driving ability of the inverter 18 is small compared with them of the transistor 28 and the fuse 10. In the second embodiment, because the transfer gate 38 can be omitted, the number of parts can be reduced, compared with the first embodiment of FIG. 2.

Figure 7:
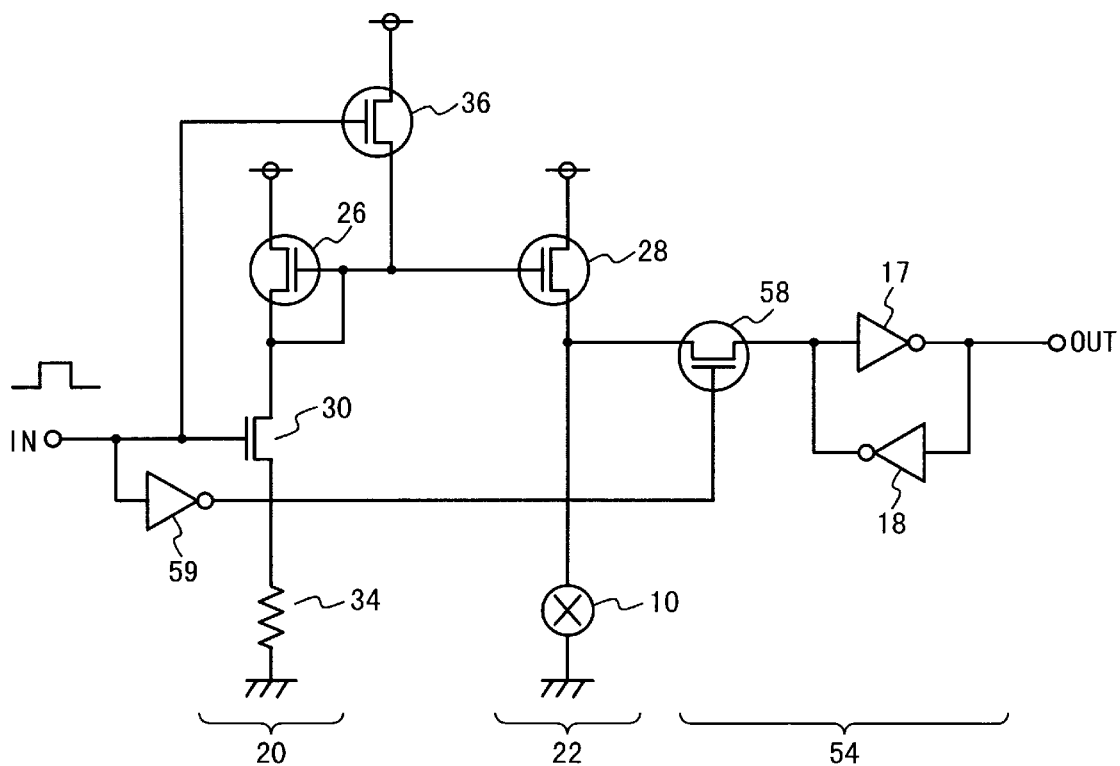
FIG. 7 is a diagram showing the redundancy circuit according to the third embodiment of the present invention.

In the fuse determination circuit of FIG. 7, the latch section 54 is composed of a transfer gate 58 and the inverters 17 and 18. The transfer gate 58 is composed of a P-channel transistor whose drain is connected to the fuse 10. A pulse signal to the input terminal IN is supplied to the gate of the P-channel transistor 58 via the inverter 59. In the fuse determination circuit, when the fuse 10 is in the ON state or the partially-cut state, the DC current flows through the fuse determining section 22 from the transistor 28 and the inverter 18 during the determination period. Because the P-channel transistor 28 is turned off when the pulse signal to the input terminal IN is set to the Low level, any current never flows from the inverter 18. However, if there is not the transfer gate 58, the output DC current of the inverter 18 of the latch section is added to flow through the fuse 10. However, because the transfer gate 58 is provided, the pulse signal to the input terminal IN is set to the Low level so that the transfer gate 58 is turned off to block off the DC current. It should be noted that the transfer gate may be the transfer gate of the N-channel transistor or the CMOS transfer gate. When the N-channel transistor is used, the inverter 59 is unnecessary. In this embodiment, because there is not N-channel transistor 32 unlike the above-mentioned fuse determination circuit, the voltage of the determination node B of the latch section 54 can be correctly determined without influence of the voltage drop due to the transistor 32.

Figure 8:
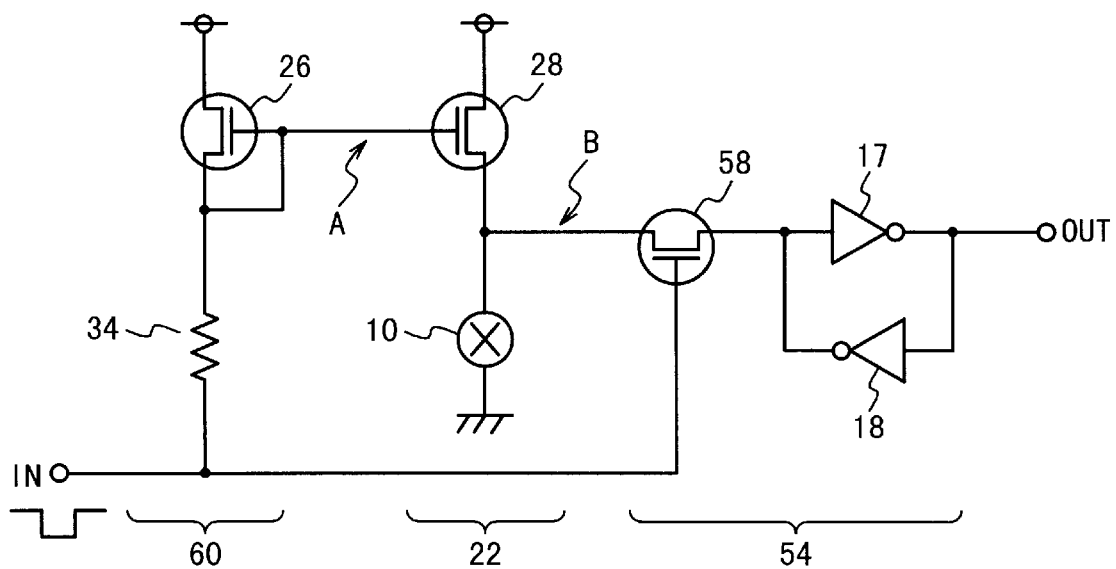
FIG. 8 is a diagram showing the redundancy circuit according to a fourth embodiment of the present invention.

The fuse determination circuit of FIG. 8 is different from the fuse determination circuit of FIG. 7 in only the structure of the reference section 60. The reference section 60 is composed of the P-channel transistor 26 and the reference resistance 34. The input terminal IN is connected with the one end of the reference resistance 34 and the gate of the transfer gate 58. It should be noted that the P-channel transistor 58 may be a N-channel transistor or a CMOS transfer gate. In this embodiment, there is an effect that the area of the fuse determination circuit can be more reduced, in addition to the effect of the fuse determination circuit of FIG. 7, because the N-channel transistor 30 and the inverter 59 can be omitted.

FIGS. 9A to 9D are waveform diagrams to explain the operation of the redundancy circuit of FIG. 8. Referring to FIGS. 9A and 9B, when the pulse signal to the input terminal IN is set to the Low level, the voltage of the node A falls down to a middle level between the power supply voltage Vcc and the ground voltage. As a result, the P-channel transistor 28 is turned on and also the P-channel transistor 58 is turned on. When the fuse 10 is in the ON state, the voltage of the determination node B is smaller than the threshold, and the output terminal OUT is in the High level. When the fuse 10 is in the OFF state, the voltage of the determination node B is larger than the threshold and the output terminal OUT is in the Low level, as shown in FIGS. 9C and 9D. Then, because the pulse signal of the input terminal is set to the High level so that the transistors 26, 28 and 58 are turned off, the voltage of the node A is set to the High level (FIG. 9B) and the current gets not to flow through the fuse 10. Also, the voltage of the node B keeps 0 V at the time of 0 V in the immediately previous state. Also, the voltage of the node B gradually approaches 0 V with discharging of the charge of the node B through the fuse 10 at the time of the middle voltage in the immediately previous state. Also, the latch section 54 keeps a state during the determination period.

Figure 10:
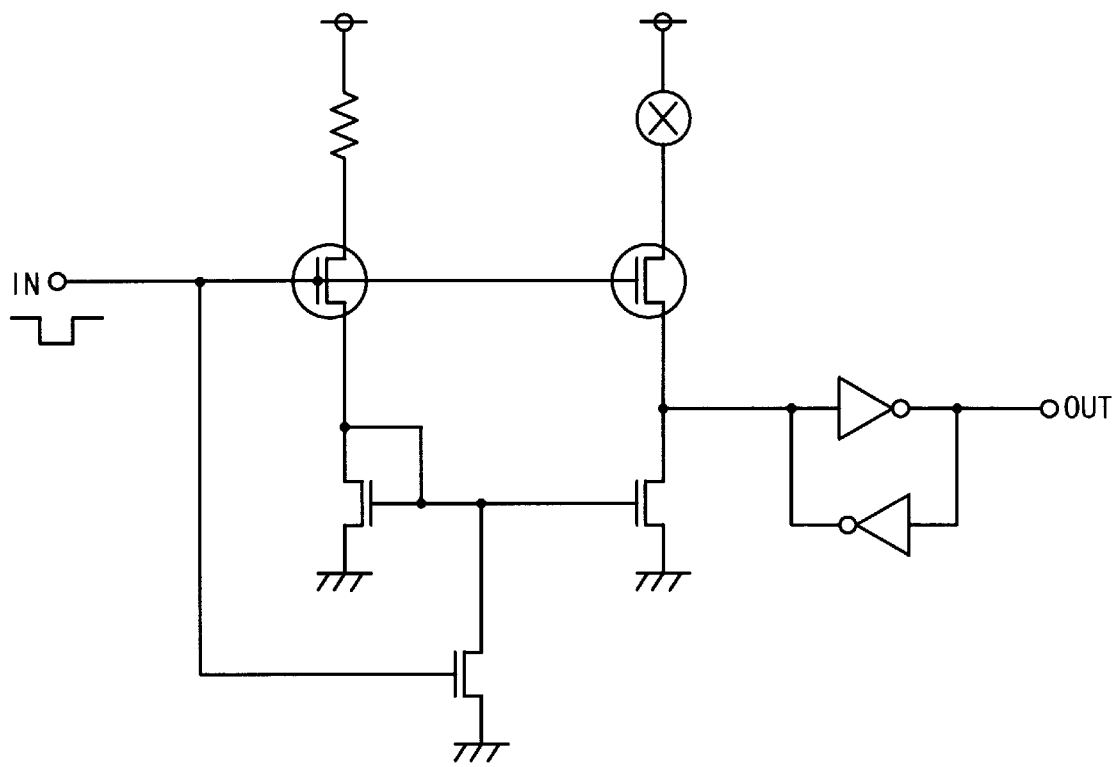
FIG. 10 is a diagram showing the redundancy circuit according to the fifth embodiment of the present invention.
Figure 11:
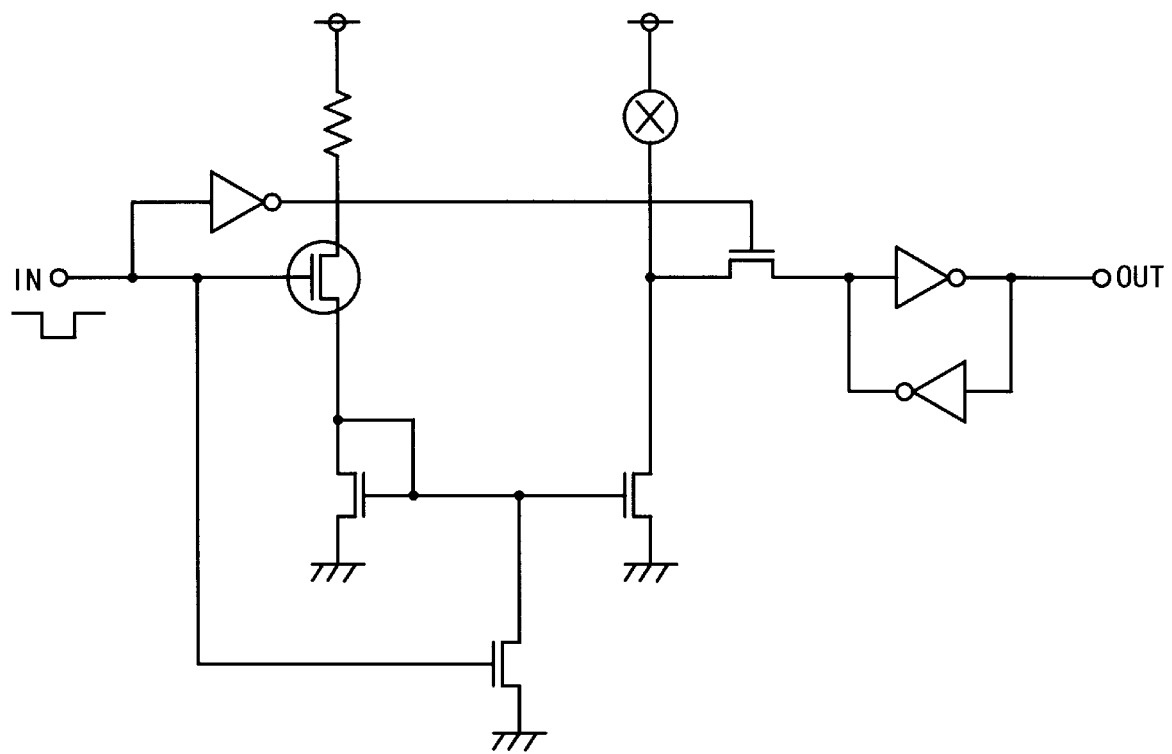
FIG. 11 is a diagram showing the redundancy circuit according to the sixth embodiment of the present invention.
Figure 12:
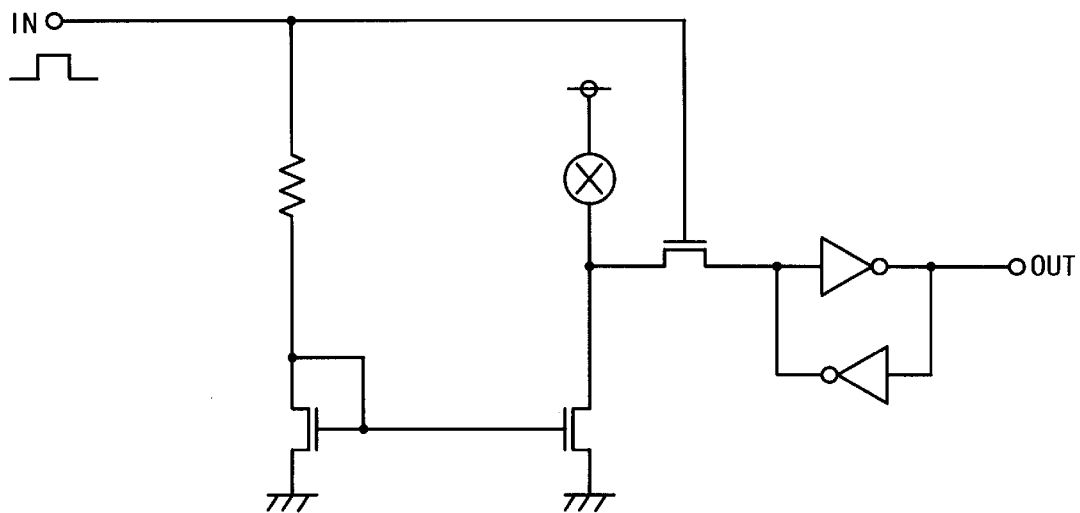
FIG. 12 is a diagram showing the redundancy circuit according to the seventh embodiment of the present invention.

In the above embodiments, the transistors of the current mirror circuit are the P-channel transistor. However, it is possible to use N-channel transistors. The fuse determination circuits according to the fifth to seventh embodiments in which the current mirror circuit is composed of the N-channel transistors are shown in FIGS. 10 to 12. FIG. 10 is a circuit corresponding to FIG. 6. FIG. 11 is a circuit corresponding to FIG. 7. FIG. 12 is a circuit corresponding to FIG. 8.

In the examples of the fuse determination circuit shown in FIGS. 6 to 12, the latch section is composed of the inverters connected reversely and in parallel. However, the latch section may includes the transfer gate 8 as in the latch section shown in FIG. 2. It is possible to surely latch the data in response to the pulse signal to the input terminal IN, through the existence of such the transfer gate.

Figure 13:
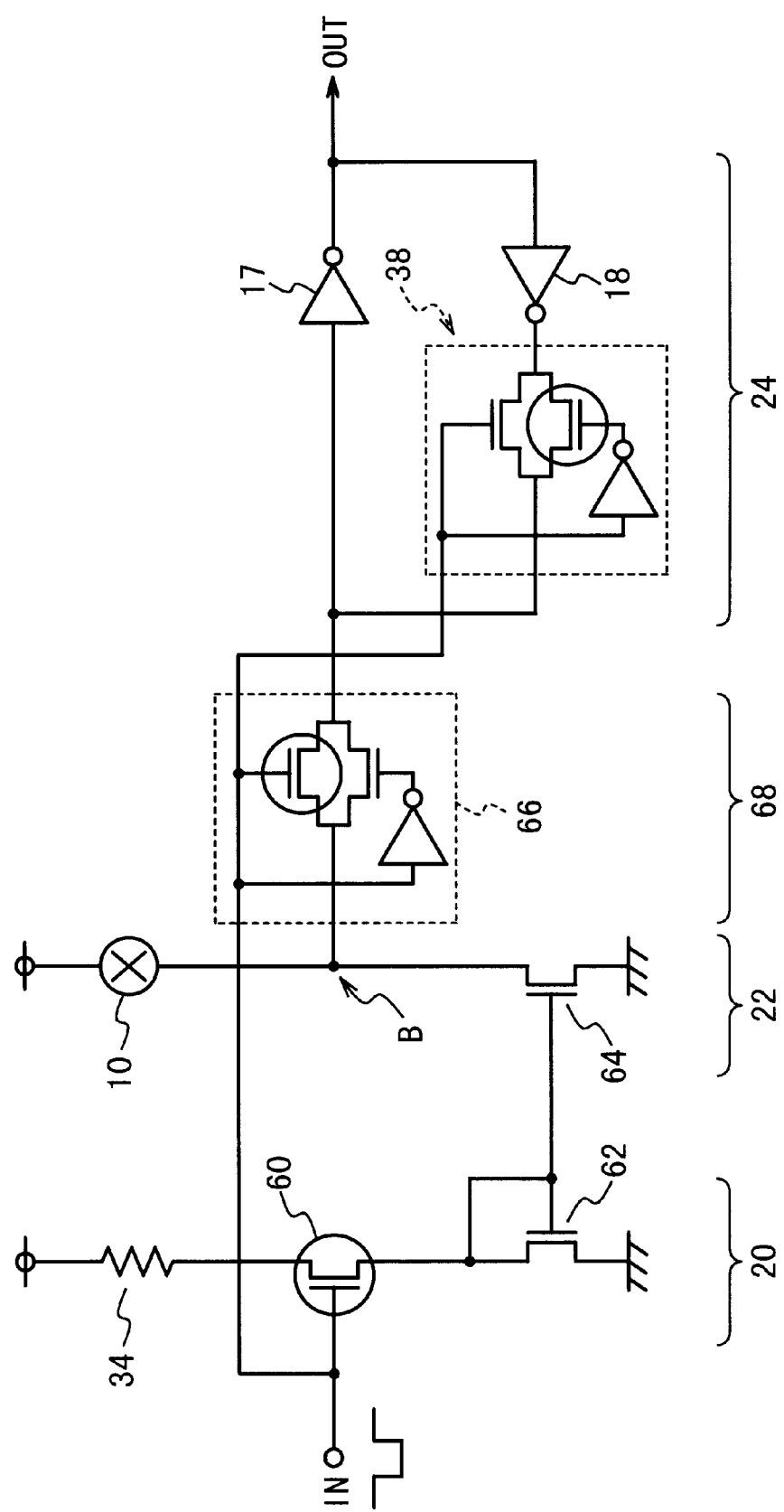
FIG. 13 is a diagram showing the redundancy circuit of the semiconductor memory device according to an eighth embodiment of the present invention.

FIG. 13 shows the fuse determination circuit which is provided with the transfer gate 38 for the latch section. The fuse determination circuit is composed of the reference section 20, the fuse section 22, the latch section 24 and the switching element 68 which is arranged between the latch section 24 and the fuse section 22. The reference section 20 is composed of an N-channel metal oxide semiconductor transistor 62, a P-channel MOS transistor 60 and a reference resistance 34. The fuse section 22 is composed of an N-channel metal oxide semiconductor transistor 64 and the fuse 10. The switching element 68 is composed of a transfer gate 66. The latch section 24 is composed of inverters 17 and 18 which are connected in a reverse manner in parallel and a transfer gate 38 which is inserted on the output side of the inverter 18. The N-channel transistor 62 of the reference section 20 forms a current mirror circuit together with the N-channel transistor 64 of the fuse determining section 22.

The operation of the fuse determination circuit of the above structure will be able to be sufficiently understood from the above description. Therefore, the operation will be described briefly.

When the one-shot FST signal of about 30 ns is supplied to the input terminal IN, the transfer gate 66 is turned on while the FST signal is during the period of the Low level, and the transfer gate 38 is turned off. At this time, i.e., during the fuse determination period, the voltage of the determination node B is inverted by the inverter 17 via the transfer gate 66 so that the output terminal OUT is set to the High level or the Low level.

When the FST signal of the input terminal IN is set to the High level, the transfer gate 66 is turned off and the transfer gate 38 is turned on to latch the voltage of the determination node B. Also, the DC current never flows from the inverter 18 to the fuse 10 because the transfer gate 66 is turned off. Therefore, the determination node B and the inverter 18 do not compete with each other. Thus, the problem can be avoided that the critical resistance value of the fuse changes in the previous latch state.

Also, the transfer gate 66 is a switching element and there is little ON resistance because of the circuit characteristic. Therefore, the transfer gate 66 is sufficient to have a minimum size on the design rule. Thus, the layout area does not increase unlike the conventional example described in conjunction with FIG. 1.

Figure 14:
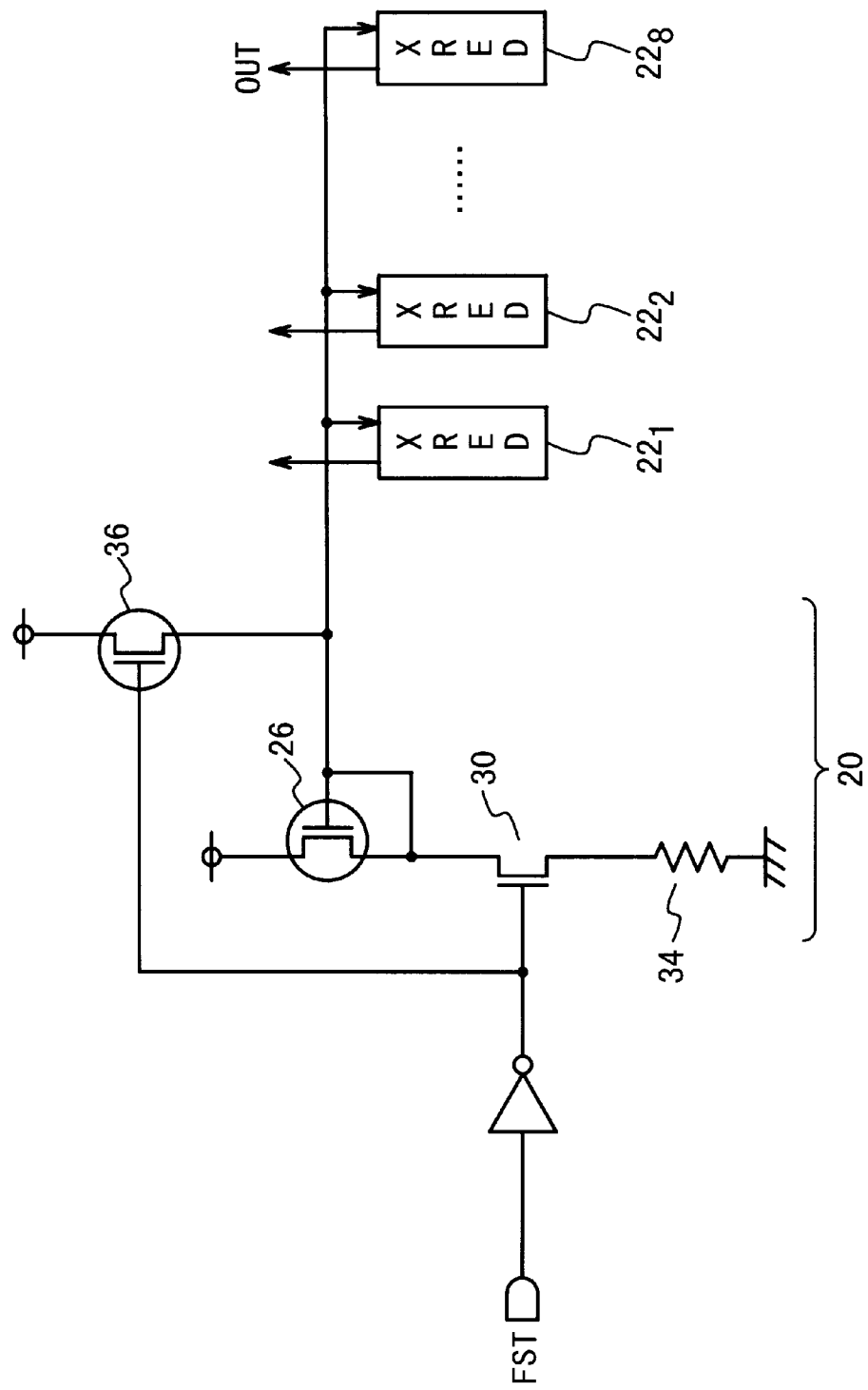
FIG. 14 is a diagram showing the semiconductor memory device according to a ninth embodiment of the present invention in which 8 fuse sections are provided.

Referring to FIG. 3 again, each of the fuse determination circuits 44, to 44, is provided with the reference section 20 (FIG. 2). However, actually, in order to reduce the layout area, the reference section 20 is not provided for each of the fuse sections 44$_1$ to 44$_8$. A block having the structure of FIG. 3 is referred to as a block XRED. In FIG. 14, 8 blocks 22$_1$ to 22$_8$ are connected and the reference section 20 is provided for the 8 blocks.

Figure 15:
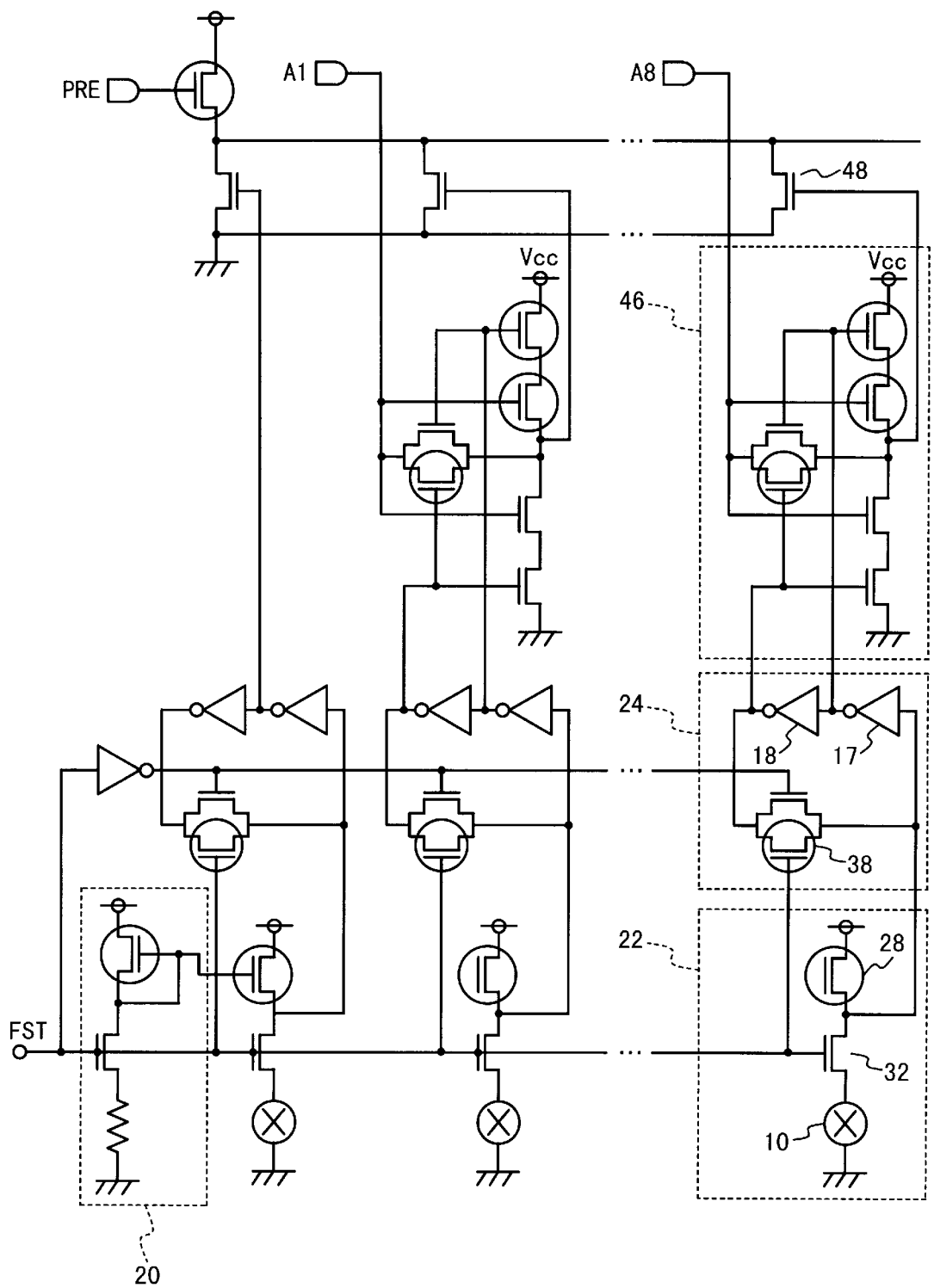
FIG. 15 is a diagram showing an example of the semiconductor memory device according to the tenth embodiment of the present invention.

FIG. 15 shows a specific circuit example of the redundancy circuit which contains the blocks XRED. That is, the single reference section 20 is provided for 72 fuse sections which do not have any reference section. In the diagram, the reference section 20, the fuse sections 22, the latch sections 24, and EXOR circuits 46 are enclosed by the broken lines, respectively.

Figure 16:
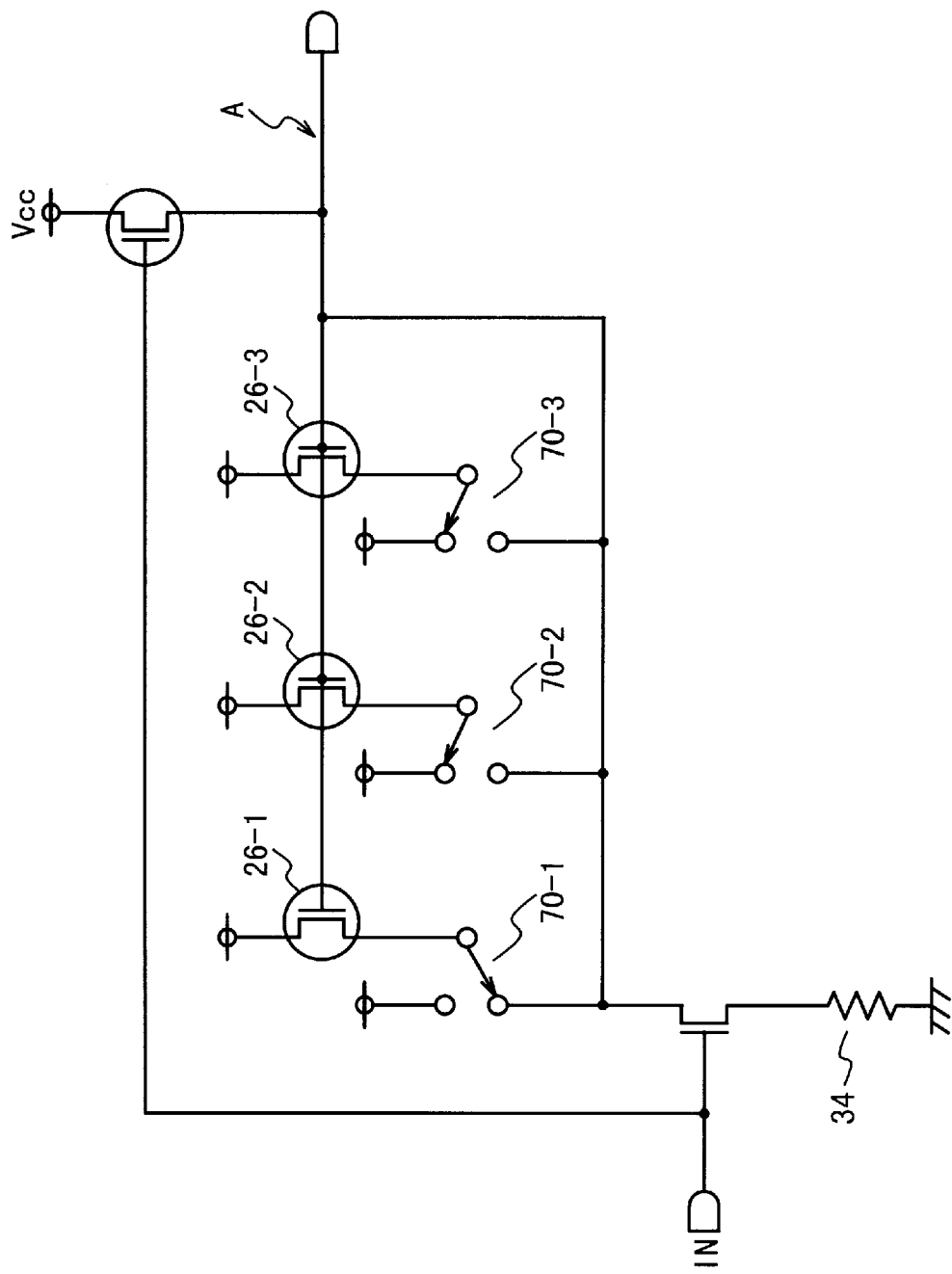
FIG. 16 is a diagram showing another example of a reference section.

FIG. 16 is a diagram showing another example of the reference section which may be provided for a plurality of blocks XRED shown in FIG. 14. In this reference section, the size of the P-channel transistor of the current mirror circuit can be adjusted. The three P-channel transistors 26-1, 26-2 and 26-3 are provided to adjust the voltage level of the node A, by switching aluminum layers 70-1, 70,-2 and 70-3. The values of (the gate widths of these P-channel transistors 26-1, 26-2 and 26-3)/(the gate lengths (W/L)) are 8/0.8, 4/0.8 and 2/0.8, respectively. By the switching aluminum layers, one of W=2, 4, 6, 8, 10, 12 and 14 can be selected. By adjusting the voltage level of the node A, the current which flows through the fuse can be adjusted. Therefore, the critical resistance of the fuse and the consumption power in the fuse can be adjusted.

It should be noted that the adjustment of the voltage level of the node A can be accomplished by adjusting the size of the reference resistance 34, in addition to the adjustment of the sizes of the transistors of the current mirror circuit.

In the above description, the power supply voltage Vcc may be externally supplied or produced in the memory device by falling down or boosting the externally supplied voltage. Also, the present invention can be applied to positive polarity or negative polarity of the power supply by changing the kind of transistors.

As described above, according to the present invention, (1) the power supply voltage dependence and temperature dependence of the critical resistance as a reference resistance of determination of the ON/OFF state of the fuse can be made small. That is, the change of the critical resistance depending on the power supply voltage and the temperature can be made small.

Also, in the conventional example, the power supply voltage Vcc is applied to the fuse in the ON state so that the large current flows. However, in the present invention, because the gate level of the transistor of the current mirror circuit of the fuse section is a middle level, the DC current which flows through the fuse during the determination period can be made small so that power consumption can be reduced.

Also, by adjusting the sizes of the transistors on the side of the current mirror circuit and the reference resistance, the critical resistance and consumption current of the fuse can be adjusted. Because the sheet resistance of the fuse, the ability of the transistor, the cutting ability of the trimmer are determined based on the manufacturing condition. Therefore, it is the advantage of using the current mirror circuit in that the critical resistance and consumption current are possible to be adjusted.

In addition, the competition between the determination node and the inverter of the latch section can be avoided. Moreover, the layout area can be made small.

What is claimed is:

1. A semiconductor memory device with a redundancy circuit comprising:

a reference section including a reference resistance and supplying a first current to said reference resistance;

a fuse section including a fuse and supplying a second current to said fuse, said second current being proportional to said first current; and a latch section having a threshold and latching a fuse state data based on said threshold and a voltage drop across said fuse, said fuse state data indicating whether or not said fuse is cut.

2. A semiconductor memory device with a redundancy circuit according to claim 1, wherein said reference section includes a first transistor which supplies said first current to said reference resistance, said fuse section includes a second transistor which supplies said second current to said fuse, and wherein a current mirror circuit comprises said first transistor and said second transistor.

3. A semiconductor memory device with a redundancy circuit according to claim 2, wherein said first and second transistors are MOS transistors, and said redundancy circuit further comprises a third transistor provided between a power supply line and gates of said first and second MOS transistors.

4. A semiconductor memory device with a redundancy circuit according to claim 3, wherein said gate of said first MOS transistor is connected to one of a source and a drain on a side of said fuse.

5. A semiconductor memory device with a redundancy circuit according to claim 3, wherein said first transistor comprises:

a plurality of fourth MOS transistors provided in parallel, gates of said plurality of fourth MOS transistors being connected to a gate of said second MOS transistor; and a plurality of switches respectively provided for said plurality of fourth MOS transistors, each of said plurality of switches selectively connecting said gate of a corresponding one of said plurality of fourth MOS transistor and one of a source and a drain of said corresponding fourth MOS transistor.

6. A semiconductor memory device with a redundancy circuit according to claim 5, wherein said plurality of fourth MOS transistors have different ratios of a gate width and a gate length.

7. A semiconductor memory device with a redundancy circuit according to claim 2, wherein said reference section includes a first switching transistor provided between said first transistor and said reference resistance, said first switching transistor being turned on in response to a detection instruction, and said fuse section includes a second switching transistor provided between said second transistor and said fuse, said second switching transistor being turned on in response to said detection instruction.

8. A semiconductor memory device with a redundancy circuit according to claim 7, wherein said detection instruction is a one-shot pulse signal.

9. A semiconductor memory device with a redundancy circuit according to claim 7, wherein said latch section includes:

a first inverter connected at its input to a node between said second transistor and said second switching transistor; and a second inverter connected at its input to an output of said first inverter and at its output to the input of said first inverter.

10. A semiconductor memory device with a redundancy circuit according to claim 9, wherein said latch section latches said fuse state data based on a voltage at said node and said threshold of said first inverter.

11. A semiconductor memory device with a redundancy circuit according to claim 9, wherein said latch section further includes a gate circuit which is provided between said node and said input of said first inverter, and which sets a path between said node and said input of said first inverter to a conductive state in response to said detection instruction.

12. A semiconductor memory device with a redundancy circuit according to claim 9, wherein said latch section further includes a gate circuit which is provided between said input of said first inverter and said output of said second inverter, and which sets a path between said input of said first inverter and said output of said second inverter to a conductive state in response to said detection instruction.

13. A semiconductor memory device with a redundancy circuit according to claim 1, wherein said reference resistance and said fuse are formed of the same material.

14. A semiconductor memory device with a redundancy circuit according to claim 1, further comprising a switching circuit provided between said fuse section and said latch section and connection said fuse section to said latch section during a determination period for determining whether or not said fuse is cut.

15. A semiconductor memory device comprising:

a reference section including a reference resistance and supplying a first current to said reference resistance;

a plurality of fuse sections respectively provided for address bits, wherein each of said plurality of fuse sections includes a fuse and supplying a second current to said fuse, said second current being proportional to said first current; and a plurality of latch sections respectively provided for said plurality of fuse sections, wherein each of said plurality of latch sections has a threshold and latches a fuse state data of a corresponding one of said plurality of fuse sections based on said threshold and a voltage drop across said fuse of said corresponding fuse section, said fuse state data indicating whether or not said fuse is cut.

16. A semiconductor memory device according to claim 15, wherein said reference section includes a first transistor which supplies said first current to said reference resistance, each of said plurality of fuse sections includes a second transistor which supplies said second current to said fuse, and wherein a current mirror circuit comprises said first transistor and said second transistors.

17. A semiconductor memory device according to claim 16, wherein said first and second transistors are MOS transistors, and said semiconductor memory device further comprises a third transistor provided between a power supply line and gates of said first and second MOS transistors.

18. A semiconductor memory device according to claim 17, wherein said gate of said first MOS transistor is connected to one of a source and a drain on a side of said fuse.

19. A semiconductor memory device according to claim 18, wherein said plurality of fourth MOS transistors have different ratios of a gate width and a gate length.

20. A semiconductor memory device according to claim 17, wherein said first transistor comprises:

a plurality of fourth MOS transistors provided in parallel, gates of said plurality of fourth MOS transistors being connected to a gate of said second MOS transistor; and a plurality of switches respectively provided for said plurality of fourth MOS transistors, each of said plurality of switches selectively connecting said gate of a corresponding one of said plurality of fourth MOS transistor and one of a source and a drain of said corresponding fourth MOS transistor.

21. A semiconductor memory device according to claim 16, wherein said reference section includes a first switching transistor provided between said first transistor and said reference resistance, said first switching transistor being turned on in response to a detection instruction, and each of said plurality of fuse sections includes a second switching transistor provided between said second transistor and said fuse, said second switching transistor being turned on in response to said detection instruction.

22. A semiconductor memory device according to claim 21, wherein said detection instruction is a one-shot pulse signal.

23. A semiconductor memory device according to claim 21, wherein each of said plurality of latch sections includes:

a first inverter connected at its input to a node between said second transistor and said second switching transistor in said corresponding fuse section; and a second inverter connected at its input to an output of said first inverter and at its output to the input of said first inverter.

24. A semiconductor memory device according to claim 23, wherein each of said plurality of latch sections latches said fuse state data based on a voltage at said node and said threshold of said first inverter in said corresponding fuse section.

25. A semiconductor memory device according to claim 23, wherein each of said plurality of latch sections further includes a gate circuit which is provided between said node and said input of said first inverter in said corresponding fuse section, and which sets a path between said node and said input of said first inverter in said corresponding fuse section to a conductive state in response to said detection instruction.

26. A semiconductor memory device according to claim 23, wherein each of said plurality of latch sections further includes a gate circuit which is provided between said input of said first inverter and said output of said second inverter in said corresponding fuse section, and which sets a path between said input of said first inverter and said output of said second inverter in said corresponding fuse section to a conductive state in response to said detection instruction.

27. A semiconductor memory device according to claim 15, wherein said reference resistance and said fuses are formed of the same material.

28. A semiconductor memory device according to claim 15, further comprising:

a control fuse section including a control fuse and supplying a third current to said control fuse, said third current being proportional to said first current;

a latch section having a threshold and latching a control fuse state data of said control fuse section based on said threshold and a voltage drop across said control fuse in said control fuse section, said control fuse state data indicating whether or not said fuse is cut;

an address determining section determining whether said fuse state data from said plurality of fuse sections are all coincident with said address bits in units of address bits, and outputting a permission signal to permit access to redundancy memory cells when said fuse state data from said plurality of fuse sections are all coincident with said address bits in units of address bits; and a driving circuit driving said address determining section in response to said control fuse state data.

29. A semiconductor memory device according to claim 28, wherein said reference resistance, said fuses and said control fuse are formed of the same material.

30. A semiconductor memory device with a redundancy circuit comprising:

a reference section including a reference resistance and supplying a first current to said reference resistance;

a fuse section including a fuse and supplying a second current to said fuse, said second current being proportional to said first current; and a determining section comparing a threshold and a voltage drop across said fuse to determine whether a fuse is cut.

31. A semiconductor memory device with a redundancy circuit according to claim 30, wherein a determination period circuit permitting said supplies of said first and second current for a determination period.

32. A semiconductor memory device with a redundancy circuit according to claim 30, wherein said reference resistance and said fuse are formed of the same material.

* * * * *